US006874068B1

(12) United States Patent
Mattausch

(10) Patent No.: US 6,874,068 B1
(45) Date of Patent: Mar. 29, 2005

(54) SHARED MEMORY

(75) Inventor: Hans Jürgen Mattausch, Higashi-Hiroshima (JP)

(73) Assignee: Hiroshima University, Hiroshima (JP)

( * ) Notice: Subject to any disclaimer, the term of this patent is extended or adjusted under 35 U.S.C. 154(b) by 118 days.

(21) Appl. No.: 09/500,254

(22) Filed: Feb. 8, 2000

(30) Foreign Application Priority Data

Feb. 12, 1999 (JP) .......................................... 11-033753

(51) Int. Cl.[7] .......................... G06F 12/02; G06F 13/16
(52) U.S. Cl. ...................................... 711/149; 711/165
(58) Field of Search .............................. 711/120, 124, 711/130, 131, 141, 148, 149, 165; 365/230.05; 714/6, 7

(56) References Cited

U.S. PATENT DOCUMENTS

| 4,672,577 | A | | 6/1987 | Hirose et al. ................ 365/114 |
| 5,469,549 | A | * | 11/1995 | Simpson et al. ............ 709/213 |
| 5,495,570 | A | * | 2/1996 | Heugel et al. ................ 714/11 |
| 5,590,349 | A | * | 12/1996 | Robinson et al. ............. 712/36 |
| 5,802,561 | A | * | 9/1998 | Fava et al. ................... 711/120 |
| 6,021,472 | A | * | 2/2000 | Hamaguchi et al. ........ 711/141 |
| 6,148,375 | A | * | 11/2000 | Baylor et al. ................ 711/130 |
| 6,205,523 | B1 | * | 3/2001 | Joffe et al. ................... 711/150 |
| 6,223,260 | B1 | * | 4/2001 | Gujral et al. ................ 711/145 |
| 6,321,298 | B1 | * | 11/2001 | Hubis .......................... 711/124 |
| 6,434,674 | B1 | * | 8/2002 | DeWilde et al. ............. 711/149 |
| 6,480,927 | B1 | * | 11/2002 | Bauman ...................... 710/317 |

FOREIGN PATENT DOCUMENTS

| JP | 61-3450 | 1/1986 |
| JP | 61003450 A | 1/1986 |
| JP | 3100991 A | 4/1991 |
| JP | 5282869 A | 10/1993 |
| WO | WO 92/02885 A1 | 2/1992 |

* cited by examiner

*Primary Examiner*—Gary Portka
(74) *Attorney, Agent, or Firm*—Alston & Bird LLP

(57) ABSTRACT

A shared memory includes a plurality of multi-port memories each having at least one port with a copybus-function, and at least one port accessible from the user side. At least one copybus is connected to one of the ports with the copybus-function. The shared memory copies contents of one of the multi-port memories, which has been changed by a writing operation from the user side, to other multi-port memories through at least one copybus.

5 Claims, 4 Drawing Sheets

SHARED MEMORY

BACKGROUND OF THE INVENTION

1. Field of the Invention

The present invention relates to a shared memory contained in a data processing subsystem for an electronic system such as a parallel data processing system, an artificial intelligence system or a multimedia system.

2. Description of the Related Art

As known in the art, data processing subsystems perform complex calculations and/or complex user services simultaneously. It is expected that improved systems will be developed so as to incorporate an increased number of subsystems.

There are systems as shown in FIG. 1 that comprise a shared memory 3 in the form of a bus-system, a crossbar switch, an optically coupled common memory (OCCM) or the like, which is accessible from users 1 in the form of processors, data processing subsystems or the like, through ports 2-1 to 2-n. In this case, it is required that an access to a shared-data or a program base is allowed independently from all subsystems, in parallel and at a high access bit rate.

Since an effective integration technique suitable for forming one or more systems in one chip has not been realized so far, there will be imminent need for the development of a shared memory with a large number of ports and a high access bit rate, which has not been specifically focussed in the past. in this instance, however, disadvantages will become more apparent particularly in a large-sized computer having a plurality of executing-functions, in that the above-mentioned requirement is not sufficiently met. Various solutions for removing such potential disadvantages are known, such as cache memory, banking technique, crossbar switch, bus-system, etc.

Known solutions largely depend on techniques known from the design of large-sized computers, so that there are some boundary conditions limiting the degrees of design freedom. One of such boundary conditions is the use ofcommercial semiconductor parts in the design of a computer system. Therefore, with this boundary condition, the computer system should be constructed based on a conventional 1-port memory as a basic element.

Traditionally, as an approach for allowing an access to a shareddata or a program base independently for all subsystems, in parallel and at a high access bit rate in a system integrated in one substrate, a technique known in the field of a large-sized computer system is applied in the integration technique.

FIG. 2 shows a basic structure of the system according to the above-mentioned traditional approach, wherein the shared memory is constructed as a multi-port memory with a plurality of ports. The system further includes ports 4-1, 4-2, 4-3, . . . , 4-k-2, 4-k-1, 4-k of the number k not less than 2 accessible for user side; single-port memories 5-1, 5-2, 5-3, . . . , 5-m-1, 5-m of the number m not less than 2; and a switching network 6 in the form of a bus-system, a crossbar switch, a multi-stage interconnecting network, which performs a switching operation so as to connect any of the ports 4-1, 4-2, 4-3, . . . , 4-k-2, 4-k-1, 4-k to one of the single-port memories 5-1, 5-2, 5-3, . . . , 5-m-1, 5-m.

A technique adopting the cache memory or a banking method is mainly applied to increase the access bit rate of the single port memory. Especially in the case of DRAM, reference may be had to Y. Nitta et al, "A 1.6 GB/s Data Rate 1 GB Synchronous DRAM with Hierarchical Square-Shaped Memory Block and Distributed Bank Architecture" ISSCC Dig. of Tech. Papers, pp. 376–377, 1996.

The cache memory is a high speed buffer memory arranged at a connection between a low speed memory and a user terminal, before or after the switching network 6 in FIG. 2. The cache memory is occupied with a copy of an internal data which may be accessed in the next access cycle. To this end, when selecting a data to be occupied in the cache memory, a special algorithm is utilized, which depends on the application of the system itself.

The banking method is perfonned based on the fact that the speed of the data transmission through a bus is much higher than that of a memory access. Therefore, it is possible to read the data substantially in parallel from a plurality of memory blocks, store the data in a high speed register on the way, and transfer the data to external user terminals sequentially through one or more high speed data buses. In this way, the data can be taken from the memory in shorter time intervals than the access time. In this case, it is necessary to consider the waiting time, i.e. a time needed from a requirement of the data to the data transfer, which is normally longer than the access time. However, the banking method is performed in a satisfactory manner only when sequentially required data are stored in different memory blocks from each other. If it is required to access to the memory block in which a previous access has not yet been completed, the later access should be rejected or delayed.

The switching network 6 is mainly implemented in the crossbar switch or a multi-stage network. An example as applied to a conventional shared memory with the crossbar switch is disclosed in K. Guttag, R. J. Gove, and J. R. Van Aken, "A Single-Chip Multiprocessor for Multimedia: The MVP", IEEE Computer Graphics & App., vol. 12, pp. 53–64, etc.

However, the conventional shared memory as shown in FIG. 2 has the following limitations.

(i) The number of ports 4-1, 4-2, 4-3, . . . , 4-k-2, 4-k-1, 4-k is relatively small, typically not more than 10.

(ii) The number of single-port memories 5-1, 5-2, . . . , 5-m-1, 5-m is relatively small.

Due to the relatively small number of single port memories, especially, there may occur an access conflict to lower the access bit rate. As a result, it is desirable that the number of the single-port memories 5-1, 5-2, . . . , 5-m-1, 5-m is made as large as possible.

One may then consider that such a problem may be directly and readily resolved by increasing the number of ports required for each memory cell. In this case, however, there may occur another difficulty relating to the layout of the shared memory, in that a number of decoders must be accommodated within a width of respective arrays of the cells, besides that the occupied area of the cells increases as the number of the ports increases.

Moreover, the shared memory should be as compact and simple as possible, and should have a power consumption which is made as low as possible.

DISCLOSURE OF THE INVENTION

It is an object of the present invention to provide a shared memory having an increased number of ports accessible from the user side and being capable of operating at a high access bit rate.

It is another object of the present invention to provide a shared memory which can be made as compact as possible.

It is another object of the present invention to provide a shared memory which is simple in construction.

It is another object of the present invention to provide a shared memory having an effective arrangement and occupying a minimized area.

It is another object of the present invention to provide a shared memory with a significantly reduced power consumption.

According to the present invention, there is provided a shared memory comprising:

- a plurality of multi-port memories each having at least one port with a copybus-function, and at least one port accessible from the user side; and
- at least one copybus to be connected to at least one port with the copybus-function;
- wherein the shared memory is adapted to copy contents of one of the multi-port memories, which has been changed by a writing operation from the user side, to other multi-port memories through at least one copybus.

With the above-mentioned arrangement according to the invention, a plurality of multi-port memories are used and contents consistency among these multi-port memories is kept. It is therefore possible to increase the number of ports accessible from the user side compared to the case wherein one multi-port memory is used as the shared memory. Also, the shared memory is capable of operating at a high access bit rate because a plurality of the copybuses can be used.

The shared memory according to the present invention can be typically formed with an integrated circuit technique. In this instance, it is possible to realize a shared memory which is made as compact as possible. The integrated circuit technique may be a two-dimensional integrated circuit technique which allows the construction of the shared memory to be simplified. Alternatively, the integrated circuit technique may be a three-dimensional integrated circuit technique which allows the occupied area of the shared memory to be used highly effectively.

The shared memory according to the present invention may be adapted to copy the content electronically, though it is more preferable to copy the contents optically. When the contents are copied optically, it is possible to operate the system at a high access bit rate and with a reduced power consumption.

BRIEF DESCRIPTION OF THE GRAWINGS

An embodiment of the shared memory according to the present invention will be explained below with reference to the accompanying drawings, wherein similar parts are denoted by similar signs.

DESCRIPTION OF THE PREFERRED EMBODIMENTS

Figure 1:
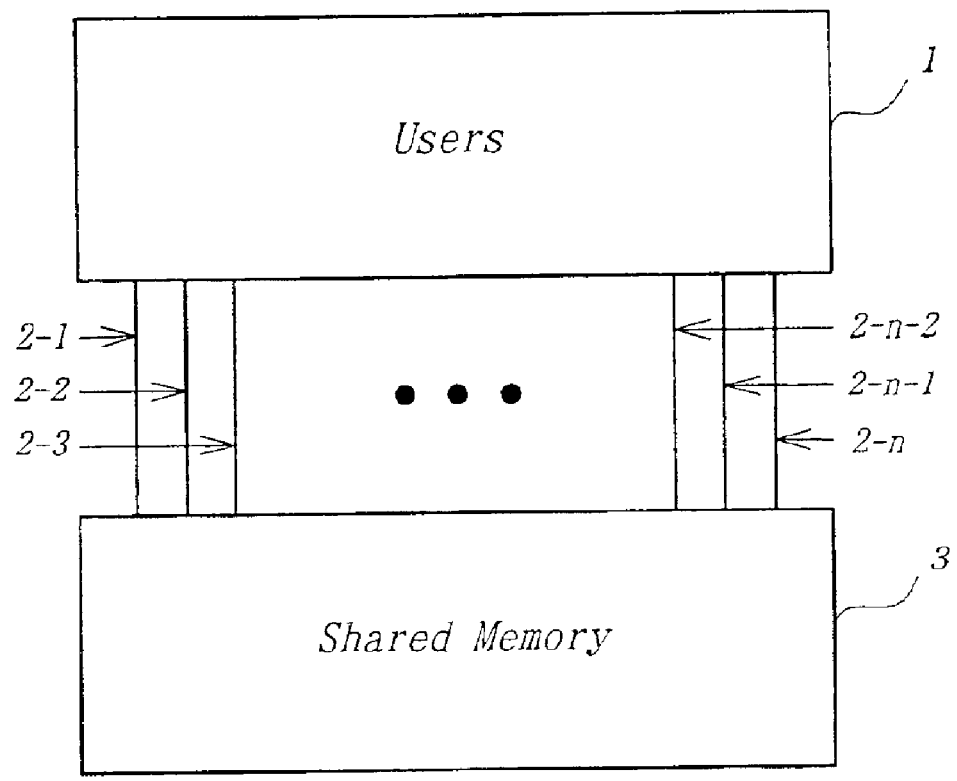
FIG. 1 is a schematic diagram showing a conventional system having a shared memory.
Figure 2:
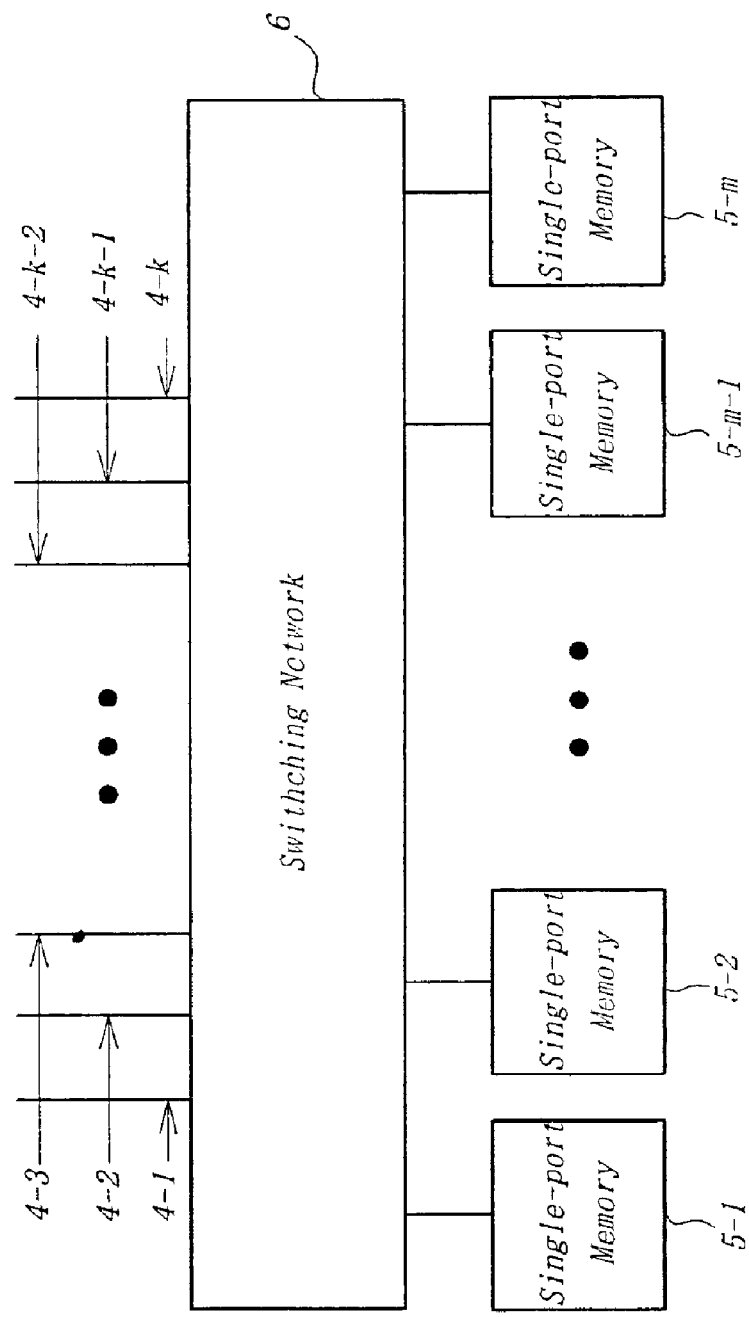
FIG. 2 is a schematic diagram showing a conventional shared memory.
Figure 3:
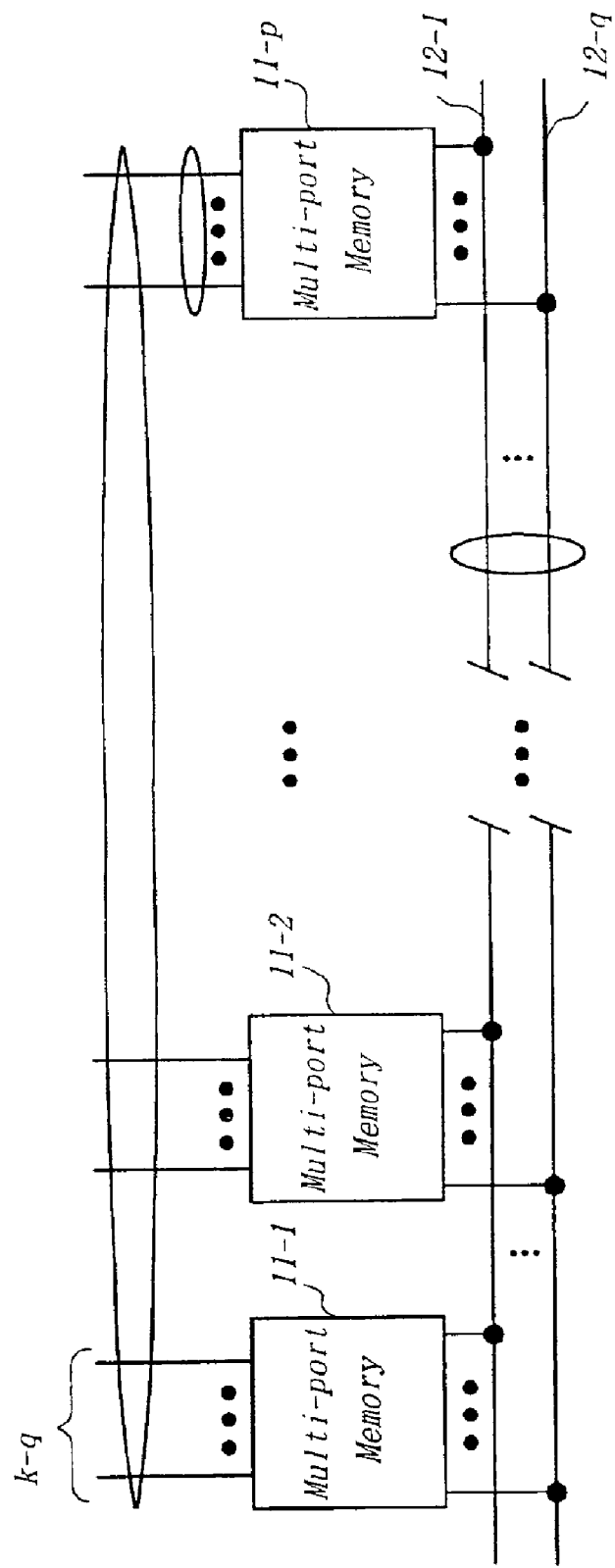
FIG. 3 is a schematic diagram showing an embodiment of the shared memory according to the invention.

FIG. 3 is a schematic diagram showing an embodiment of the shared memory according to the invention. The shared memory comprises: multi-port memories 11-1, 11-2, . . . , 11-p of the number p, typically not less than 2; and copybuses 12-1, . . . , 12-q of the number q, generally chosen in accordance with the necessities to keep the contents consistency. The shared memory is formed with the three-dimensional integrated technique. Each multi-port memory 11-1, 11-2, . . . , 11-p has ports of the number k, typically not less than 2. The ports of the number q of these ports have the copybus-function, and one of the ports of the number q is connected to each copybus 12-1, . . . , 12-q. The ports of the number k-q which are all ports excluding the ports of the number q are accessible from user side. Therefore, as to each multi-port memory 11-1, 11-2, . . . , 11-p, the ports of the number k-q are accessible from the user side, and thus the ports of a total of the number n=p.(k-q) are accessible from the user side. As a result, the shared memory as shown in FIG. 3 is constructed as a multi-port memory having the ports of the number n.

Each multi-port memory 11-1, 11-2, . . . , 11-p may be constructed by any known multi-port memory. Each copybus 12-1, . . . , 12-q may be realized not only as an internal copybus such as shown in JP-A-61-3450 but also as an external copy bus. Preferably, through the internal copybus, contents in one of the multi-port memories 11-1, 11-2, . . . , 11-p are copied optically such as shown in above-mentioned JP-A-61-3450. Through the external copybus, the contents may be copied electronically or optically, but it is preferable to copy the contents optically in view of the power consumption and the operation of the shared memory at a high access bit rate. If it is desirable that a copy speed and an access bit rate of the contents are as high as possible, the number q, which represents the number of the ports with the copy-function, should be as large as possible. On the other hands, if it is desirable that the number of users is as large as possible, the ports of the number k-q accessible from the user side should be as large as possible. In other words, the number q should be as small as possible. Meanings of the internal copybus and the external copybus will be explained below. The band width available for the copy process to keep the contents consistency is determined by the copybuses of the number q, and it can be selected in accordance with the necessity of the system.

Figure 4:
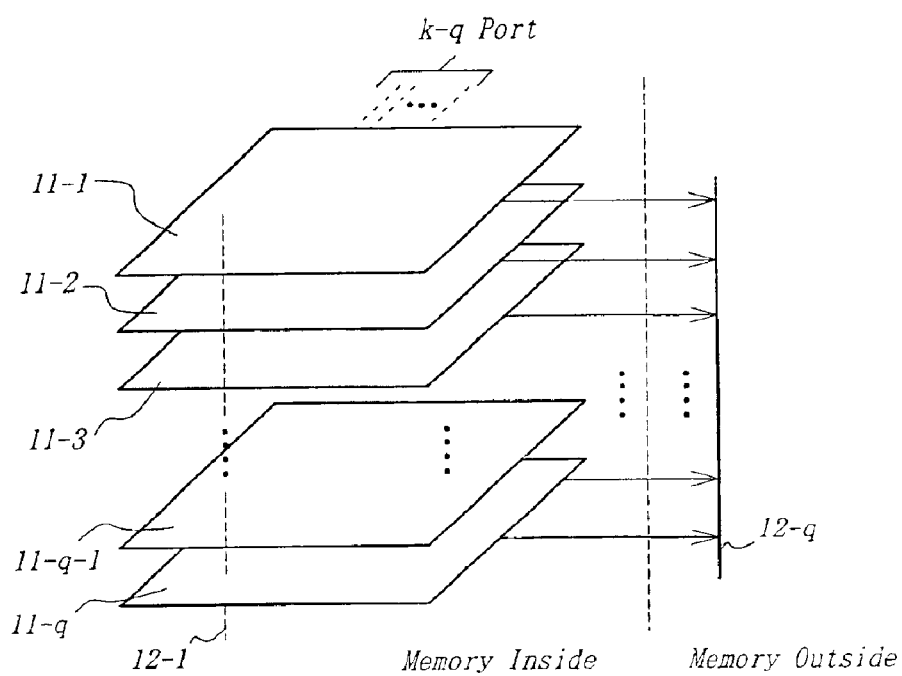
FIG. 4 is a schematic diagram explaining an internal bus and an external bus.
Figure 5:
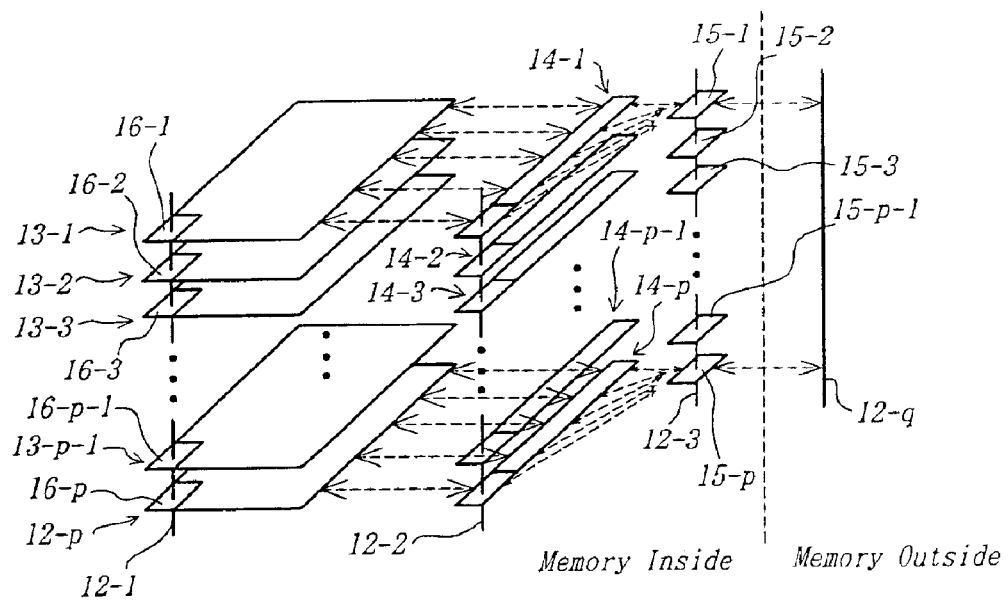
FIG. 5 is a schematic diagram showing a detail of FIG. 4.

FIG. 4 is a schematic diagram explaining the internal bus and the external bus, and FIG. 5 is a schematic diagram showing a detail of FIG. 4. In FIGS. 4 and 5, the copybus 12-1 is the internal copybus, and the copybus 12-q is the external copybus. The internal copybus is connected to internal ports with the copybus function. For example, if the multi-port memories 11-1, 11-2, . . . , 11-p are composed of memory fields 13-1, 13-2, 13-3, . . . , 13-p-1, 13-p; row buffers 14-1, 14-2, 14-3, . . . , 14-p-1, 14-p; and output buffers 15-1, 15-2, 15-3, . . . , 15-p-1, 15-p, respectively, it is possible to realize the internal port connected to multi-port memories 11-1, 11-2, . . . , 11-p at the level of the respective memory fields 13-1, 13-2, 13-3, . . . , 13-p-1 or 13-p of respective single memory cells 16-1, 16-2, 16-3, . . . , 16-p-1, 16-p, in this case, the internal port is connected to the copybus 12-1; at the level of the respective row buffers 14-1, 14-2, 14-3, . . . , 14-p-1, 14-p, in this case, the internal port is connected to the copybus 12-2 as the internal copybus; or at the level of the respective output buffers 15-1, 15-2, 15-3, . . . , 15p-1, 15-p, in this case, the internal port is connected to the copybus 12-3 as the internal copybus. On the other hand, the external copybus has the copybus-function and/or is connected to at least one external port functioning as at least one port at the user side.

A data is written into the shared memory, or is read from the shared memory through each of the ports of the number n in parallel and independently. Each of the ports of the number n has generally Wi bits of a word length. Each copybus 12-1, . . . , 12-q has Wc bits of a word length equal to that of the port connected to the corresponding copybus.

The copybuses 12-1, . . . , 12-q are required because the identity of the data stored in each multi-port memory 11-1, 11-2, . . . , 11-p should be maintained, in other words, the data consistency should be kept. Therefore, the copybuses are not used as long as the data is read from one of the multi-port memories. If one or more data bits stored in one of the multi-port memories 11-1, 11-2, . . . , 11-p are changed because of the writing operation from the user side, the corresponding one or more data bits in other multi-port memories should be updated.

A copying process for updating the changed data bits is performed in the following steps.

(a) The changed data bits are read from the multi-port memory whose contents have been changed to any one of copybuses 12-1, . . . , 12-q.

(b) The data bits are then written in parallel from any of the copybuses to the other multi-port memories. The parallel writing operation is possible because the copybus is connected to all other multi-port memories.

In accordance with the number of the changed data bits and the word length of each copybus 12-1, . . . , 12-q, one or several clock cycles are required in the copying process. The choice of the number of the copybuses 12-1, . . . , 12-q and the word length is determined by typical operating conditions of the multi-port memories, i.e. a data rate required for the copying process depends on the frequency with which the writing operations are performed from the user side. Of course, it is not possible to use memory bits related to the copying process from one or more external user ports during the copying process. Therefore, the access from the user side to these said memory bits should be blocked during the copying process.

The copying process should be controlled by a copying-process-management unit not shown. The copying-process-management unit should perform the following tasks.

(A) Detection of the writing operations from the user side (B) Blocking of one or more related memory locations for the access from the user side during the copying process (C) Performing the steps (a) and (b) in the above-mentioned copying process.

The copying-process-management unit may be realized in software on a dedicated processor or as a special hardware circuit.

According to the embodiment, a plurality of multi-port memories are used and contents consistency among these multi-port memories is kept. It is therefore possible to increase the number of ports accessible from the user side compared to the case wherein one multi-port memory is used as the shared memory. Also, the shared memory is capable of operating at a high access bit rate because a plurality of the copybuses can be used, and thus the access contention hardly occurs.

As the contents are copied optically, it is possible to operate the system at a high access bit rate and with a reduced power consumption.

If the contents are copied optically, the bit rate may be doubled compared to the case wherein the contents are copied electronically.

Moreover, the shared memory formed with the three-dimensional integrated technique may allow the occupied area of the shared memory to be used highly effectively compared to that of the shared memory formed with the two-dimensional integrated technique.

If an effective storage capacity, a physical storage capacity and the number of the shared memory are SCe, SCp and N, respectively, and the number of the ports accessible from the user side in a component block of the shared memory which corresponds to the multi-port memory in the present invention, and the single-port memory in the shared memory as disclosed in the above-mentioned JP-A-61-3450, is n, the following relation is established.

$$SCe = n \cdot SCp/N$$

As a result, if n equals to 1 such as in the conventional manner, it is disadvantageous for the effective storage capacity SCe to be smaller than the physical storage capacity SCp. According to the present invention, however, such a disadvantage is relieved because n may be larger than 1.

While the present invention has been described above with reference to a certain preferred embodiment, it should be noted that it was presented by way of an example only and various changes and/or modifications may be made without departing from the scope of the invention. For example, all multi-port memories have an identical number of the ports in the above-mentioned embodiment, however it is not necessary for all multi-port memories to have the identical number of the ports as far as the multi-port memory comprises at least one port, one or each of which has the copybus-function, and at least one port accessible from the user side.

The shared memory according to the present invention has only to comprise at least one internal copybus and/or at least one external copybus.

The shared memory according to the present invention may be simple in construction with the two-dimensional integrated technique instead of forming with the three-dimensional integrated technique in the above-mentioned embodiment.

The shared memory may have a large number of the ports accessible from the user side by using the shared memory according to the present invention repeatedly. In principle, each multi-port memory 11-1, 11-2, . . . , 11-p as shown in FIG. 3 may be composed of the shared memory according to the present invention comprising a plurality of the multi-port memories which has the smaller number of the ports than that of these multi-port memories.

What is claimed is:

1. A shared memory comprising:

a plurality of multi-port memories, wherein each multi-port memory has at least two ports, wherein each port has a concurrent-access function that allows for internally concurrent access via each of the ports to data stored in the multi-port memory, wherein at least one of said at least two ports has a copybus-function and wherein at least one of said at least two ports is accessible from a user side; and at least one copybus connected to each of said at least one ports having the copybus-function; wherein said shared memory is adapted to copy contents of one of said multi-port memories, which has been changed by a writing operation from said user side, to other multi-port memories through said at least one copybus.

2. The shared memory according to claim 1, wherein said contents are adapted to be copied optically.

3. The shared memory according to claim 1 or 2, wherein said shared memory is formed by an integrated circuit technique.

4. The shared memory according to claim 3, wherein said integrated circuit technique is a two-dimensional integrated circuit technique.

5. The shared memory according to claim 3, wherein said integrated circuit technique is a three-dimensional integrated circuit technique.

* * * * *